United States Patent
Ko

(10) Patent No.: US 9,058,854 B2
(45) Date of Patent: Jun. 16, 2015

(54) SEMICONDUCTOR MEMORY APPARATUS

(71) Applicant: SK hynix Inc., Icheon-si Gyeonggi-do (KR)

(72) Inventor: Jae Burn Ko, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 220 days.

(21) Appl. No.: 13/845,390

(22) Filed: Mar. 18, 2013

(65) Prior Publication Data

US 2014/0003171 A1    Jan. 2, 2014

(30) Foreign Application Priority Data

Jun. 28, 2012 (KR) .................. 10-2012-0070005

(51) Int. Cl.
| G11C 7/22 | (2006.01) |
| G11C 7/02 | (2006.01) |
| G11C 11/406 | (2006.01) |
| G11C 5/02 | (2006.01) |

(52) U.S. Cl.
CPC ............ *G11C 7/02* (2013.01); *G11C 11/40618* (2013.01); *G11C 5/02* (2013.01); *G11C 7/227* (2013.01); *G11C 11/40611* (2013.01)

(58) Field of Classification Search
CPC .................................................. G11C 11/40618
USPC .......................................... 365/194, 222, 229
See application file for complete search history.

(56) References Cited

U.S. PATENT DOCUMENTS

| 5,561,622 A * | 10/1996 | Bertin et al. ................... 365/51 |
| 2012/0008434 A1* | 1/2012 | Park ............................ 365/194 |
| 2012/0059984 A1* | 3/2012 | Kang et al. .................... 711/106 |
| 2012/0147684 A1* | 6/2012 | Schakel et al. ................ 365/194 |
| 2012/0263003 A1* | 10/2012 | Sakakibara et al. ............ 365/222 |
| 2012/0307582 A1* | 12/2012 | Marumoto et al. ........... 365/222 |
| 2014/0192606 A1* | 7/2014 | Kang et al. .................... 365/222 |

FOREIGN PATENT DOCUMENTS

KR    100472725  B1    2/2005

* cited by examiner

*Primary Examiner* — Hoai V Ho
*Assistant Examiner* — Jay Radke
(74) *Attorney, Agent, or Firm* — William Park & Associates Ltd.

(57) ABSTRACT

A semiconductor memory apparatus includes a first chip including a refresh signal generation unit which is configured to receive an external command and generate a refresh signal; and a second chip including a first delay unit which is configured to receive the refresh signal through a first through-silicon via and delay the received refresh signal, a first selection unit which is configured to output an output signal of the first delay unit to the first chip through a second through-silicon via in response to a first select signal, and a first core region which is configured to receive the output signal of the first delay unit and perform a refresh operation.

6 Claims, 4 Drawing Sheets

SEMICONDUCTOR MEMORY APPARATUS

CROSS-REFERENCES TO RELATED APPLICATION

The present application claims priority under 35 U.S.C. §119(a) to Korean application number 10-2012-0070005, filed on Jun. 28, 2012, in the Korean Intellectual Property Office, which is incorporated herein by reference in its entirety.

BACKGROUND

1. Technical Field

Various embodiments relate generally to a semiconductor integrated circuit, and more particularly, to a semiconductor memory apparatus.

2. Related Art

In general, in order to increase the memory capacity of a semiconductor memory apparatus and to decrease an occupied area, a semiconductor memory apparatus of a type in which a plurality of chips are stacked has been proposed.

Referring to FIG. 1, a conventional semiconductor memory apparatus has first to fourth chips 10, 20, 30, and 40 which are stacked upon one another. Chip select signals CS0 to CS3 for activating the chips 10, 20, 30 and 40 are respectively inputted to the chips 10, 20, 30 and 40.

The first to fourth chips 10 to 40 are activated in response to the first to fourth chip select signals CS0 to CS3, respectively.

The second chip 20 is stacked on the first chip 10, the third chip 30 is stacked on the second chip 20, and the fourth chip 40 is stacked on the third chip 30.

The first to fourth chips 10 to 40 are coupled to one another by through-silicon vias (TSV) 51 to 56 which are formed between the first to fourth chips 10 to 40.

The first to fourth chips 10 to 40 are configured to store data and output stored data. Further, each of the first to fourth chips 10 to 40 performs a refresh operation to preserve stored data.

The first to fourth chips 10 to 40 are selectively activated in response to the first to fourth chip select signals CS0 to CS3, and activated chips perform refresh operations in response to a clock enable signal CKE.

When at least two of the first to fourth chip select signals CS0 to CS3 are enabled, and the clock enable signal CKE is enabled to perform refresh operations, the chips selected by the first to fourth chip select signals CS0 to CS3 are simultaneously performed the refresh operations. However, a power noise occurs in the selected chips during the refresh operations. If the power noise occurs during the refresh operations, the refresh operations are not likely to be normally performed, whereby the stored data may not be preserved.

SUMMARY

In one embodiment of the present invention, a semiconductor memory apparatus includes: a first chip; and a second chip electrically coupled to the first chip by a first through silicon via and a second through silicon via; wherein the first chip comprises a refresh signal generation unit configured to receive an external command and generate a refresh signal, and wherein the second chip comprises a first delay unit configured to receive the refresh signal through the first through-silicon via and to delay the received refresh signal, a first selection unit configured to output an output signal of the first delay unit to the first chip through the second through-silicon via in response to a first select signal, and a first core region configured to receive the output signal of the first delay unit and to perform a refresh operation.

In an embodiment of the present invention, a semiconductor memory apparatus in which a plurality of chips are stacked and are electrically coupled by through vias, comprising: a first chip including is a refresh signal generation unit which is configured to generate a refresh signal in response to an external command; and a second chip configured to perform a refresh operation using a delayed refresh signal obtained by delaying the refresh signal and provide the delayed refresh signal to the first chip.

In an embodiment of the present invention, a semiconductor memory apparatus in which a plurality of chips are stacked and are coupled by through vias, comprising: a first chip including a refresh signal generation unit which is configured to generate a refresh signal in response to an external command; a second chip configured to generate a first delayed refresh signal by delaying the refresh signal, and perform a refresh operation in response to the first delayed refresh signal; and a third chip configured to generate a second delayed refresh signal by delaying the first delayed refresh signal, perform a refresh operation in response to the second delayed refresh signal, and output the second delayed refresh signal to the first chip, wherein the first chip includes an output selection unit which is configured to generate a totally delayed refresh signal and to output one of the second delayed refresh signal and the totally delayed refresh signal as a refresh feedback signal in response to an output control signal, wherein the totally delayed refresh signal is obtained by delaying the refresh signal by a time corresponding to a sum of a delaying time for generating the first delayed refresh signal and a delaying time for generating the second delayed refresh signal.

In an embodiment of the present invention, a semiconductor memory apparatus, comprising a base chip; a plurality of chips configured to be sequentially stacked on the base chip; and a plurality of through vias configured to couple between the base chip and a chip stacked on the base chip, and adjacent stacked chips, respectively; wherein the plurality of chips are configured to generate a plurality of delayed refresh signals, and the amount of delay of the refresh signal is increased as the number of stacking levels is higher.

BRIEF DESCRIPTION OF THE DRAWINGS

Features, aspects, and embodiments are described in conjunction with the attached drawings, in which.

DETAILED DESCRIPTION

Figure 1:
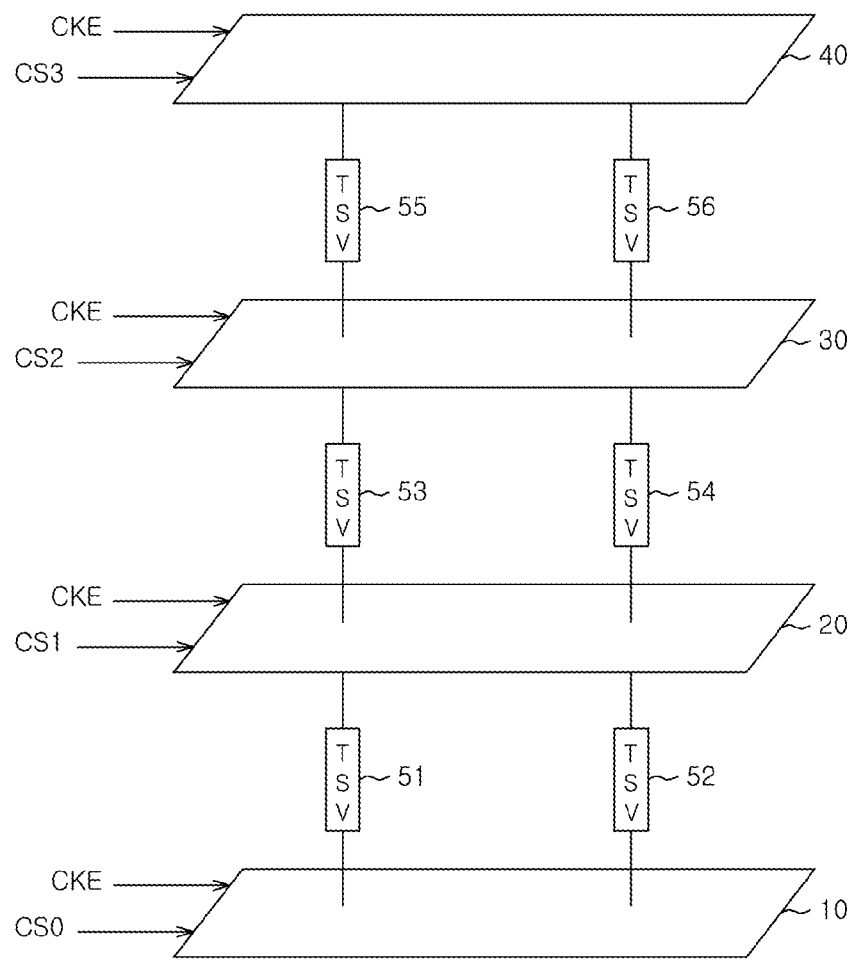
FIG. 1 is a configuration diagram of a conventional semiconductor memory apparatus.

Hereinafter, a semiconductor memory apparatus according to the present invention will be described below with reference to the accompanying drawings through exemplary embodiments.

A semiconductor memory apparatus according to an embodiment of the present invention may include a first chip 100, a second chip 200, a third chip 300, and a fourth chip 400.

The first to fourth chips 100 to 400 may be stacked and may be coupled to one another by through-silicon vias 501 to 506.

The first chip 100 may include a refresh signal generation unit 110 configured to receive external commands CS0 and CKE and generate a refresh signal RACTV. The external commands CS0 and CKE include a chip select signal CS0 which is inputted from a controller (not shown) to activate the first chip 100, and a clock enable signal CKE. For example, the first chip 100 includes the refresh signal generation unit 110 which generates the refresh signal RACTV when the chip select signal CS0 is enabled and the clock enable signal CKE is disabled.

The second chip 200 may be stacked on the first chip 100, and the second chip 200 and the first chip 100 are coupled to each other by the through-silicon vias 501 and 502.

The second chip 200 may be configured to generate a first delayed refresh signal RACTV_dl1 by delaying the refresh signal RACTV, and to perform a refresh operation in response to the first delayed refresh signal RACTV_dl1. The second chip 200 may be configured to output the first delayed refresh signal RACTV_dl1 as a refresh feedback signal RACTV_fb to the first chip 100 in response to a first select signal TOP1.

The second chip 200 may include a first delay unit 210, a first selection unit 220 and a first core region 230.

The first delay unit 210 is configured to generate the first delayed refresh signal RACTV_dl1 by delaying the refresh signal RACTV.

The first selection unit 220 is configured to output the first delayed refresh signal RACTV_dl1 as the refresh feedback signal RACTV_fb to the first chip 100 when the first select signal TOP1 is enabled.

The first core region 230 is configured to perform the refresh operation in response to the first delayed refresh signal RACTV_dl1. The refresh signal RACTV of the first chip 100 is provided to the second chip 200 using the through-silicon via 501. The first delayed refresh signal RACTV_dl1 which is generated in the second chip 200 is provided to the first chip 100 as RACTV_fb using the through-silicon via 502.

The third chip 300 may be stacked on the second chip 200, and the third chip 300 and the second chip 200 may be coupled to each other by the through-silicon vias 503 and 504.

The third chip 300 is configured to generate a second delayed refresh signal RACTV_dl2 by delaying the first delayed refresh signal RACTV_dl1, and to perform a refresh operation in response to the second delayed refresh signal RACTV_dl2. The third chip 300 may be configured to output the second delayed refresh signal RACTV_dl2 as the refresh feedback signal RACTV_fb to the first chip 100 through the second chip 200 in response to a second select signal TOP2.

The third chip 300 may include a second delay unit 310, a second selection unit 320 and a second core region 330.

The second delay unit 310 is configured to delay the first delayed refresh signal RACTV_dl1 and output the second delayed refresh signal RACTV_dl2.

The second selection unit 320 is configured to output the second delayed refresh signal RACTV_dl2 as the refresh feedback signal RACTV_fb to the first chip 100 through the second chip 200 when the second select signal TOP2 is enabled.

The second core region 330 is configured to perform the refresh operation in response to the second delayed refresh signal RACTV_dl2. The first delayed refresh signal RACTV_dl1 of the second chip 200 is provided to the third chip 300 using the through-silicon via 503. The second delayed refresh signal RACTV_dl2 which is generated in the third chip 300 is provided to the second chip 200 as RACTV_fb using the through-silicon via 504. Further, the second delayed refresh signal RACTV_dl2 is transferred to the first chip 100 as the refresh feedback signal RACTV_fb, using the through-silicon via 502.

The fourth chip 400 may be stacked on the third chip 300, and the fourth chip 400 and the third chip 300 may be electrically coupled to each other by the through-silicon vias 505 and 506.

The fourth chip 400 generates a third delayed refresh signal RACTV_dl3 by delaying the second delayed refresh signal RACTV_dl2, and performs a refresh operation in response to the third delayed refresh signal RACTV_dl3. The fourth chip 400 outputs the third delayed refresh signal RACTV_dl3 as the refresh feedback signal RACTV_fb to the first chip 100 through the third and second chips 300 and 200 in response to a third select signal TOP3.

The fourth chip 400 may include a third delay unit 410, a third selection unit 420 and a third core region 430.

The third delay unit 410 is configured to generate the third delayed refresh signal RACTV_dl3 by delaying the second delayed refresh signal RACTV_dl2.

The third selection unit 420 is configured to output the third delayed refresh signal RACTV_dl3 as the refresh feedback signal RACTV_fb to the first chip 100 through the third and second chips 300 and 200 when the third select signal TOP3 is enabled.

Figure 2:
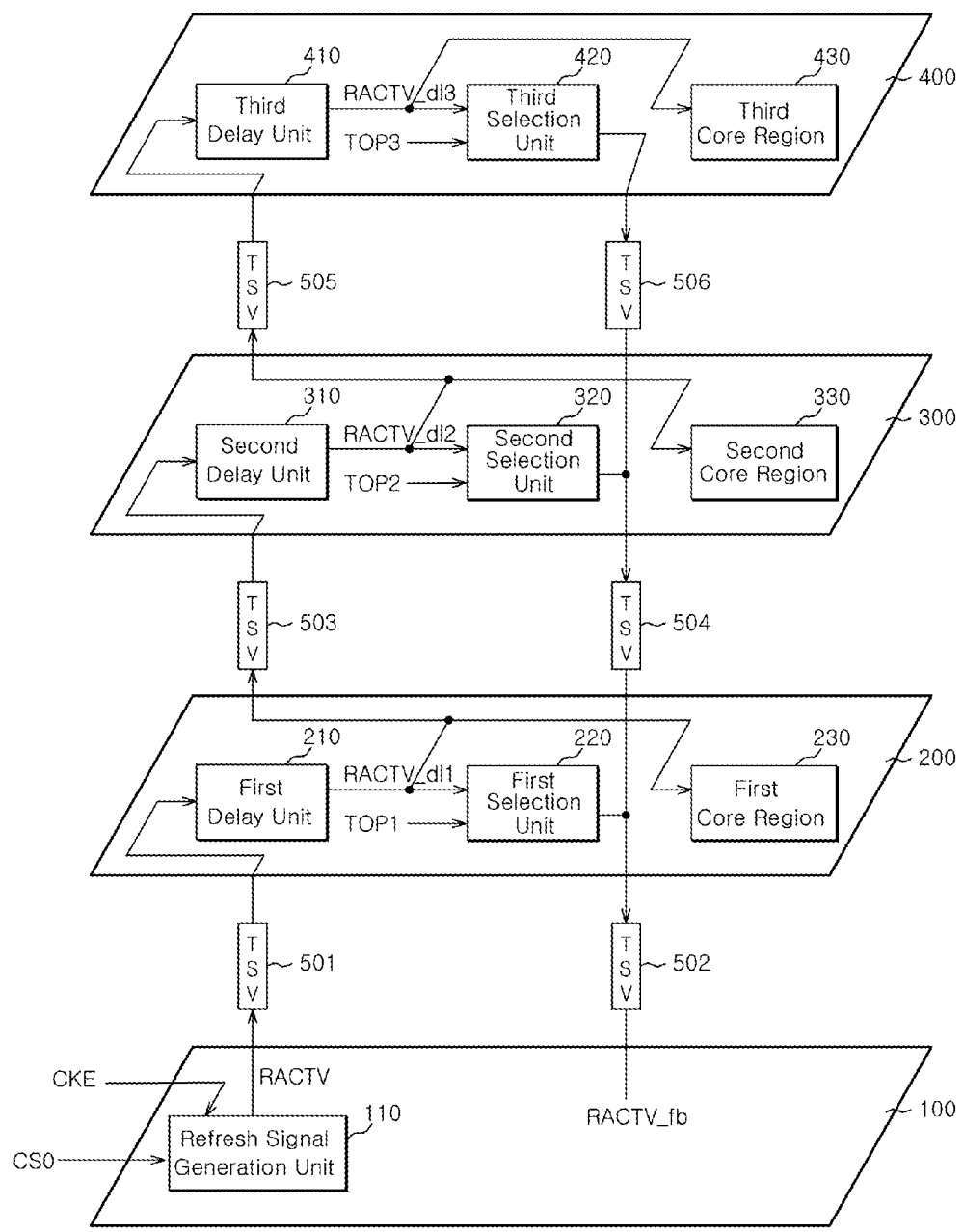
FIG. 2 is a block diagram of a semiconductor memory apparatus in accordance with an embodiment of the present invention.

The third core region 430 is configured to perform the refresh operation in response to the third delayed refresh signal RACTV_dl3. The second delayed refresh signal RACTV_dl2 of the third chip 300 is provided to the fourth chip 400 using the through-silicon via 505. The third delayed refresh signal RACTV_dl3 which is generated in the fourth chip 400 is provided to the third chip 200 and the second chip 300 through the through-silicon vias 506 and 504, respectively. That is, the third chip 300, which has received the third delayed refresh signal as RACTV_fb, outputs the signal to the second chip 200 through the through-silicon via 504. The second chip 200, which has received the third delayed refresh signal as RACTV_fb outputs the signal to the first chip 100 through the through-silicon via 502. The first to third select signals TOP1 to TOP3 are enabling signals and can be enabled one at a time. For example, the select signal which is generated in the chip positioned uppermost in a semiconductor memory apparatus in which chips are stacked can be enabled and the others are disabled. That is to say, in the semiconductor memory apparatus in which the first to fourth chips 100 to 400 are stacked as shown in FIG. 2, only the third select signal TOP3 of the fourth chip 400 as the uppermost chip, can be enabled, and the first and second select signals TOP1 and TOP2 can be disabled.

Operations of the semiconductor memory apparatus according to the embodiment of the present invention, configured as mentioned above, will be described below. It is assumed that, among the first to third select signals TOP1 to TOP3, the third select signal TOP3 is enabled and the first and second select signals TOP1 and TOP2 are disabled.

The refresh signal generation unit 110 of the first chip 100 generates the refresh signal RACTV in response to the external commands CS0 and CKE.

The refresh signal RACTV is inputted to the second chip 200 through the through-silicon via 501.

The refresh signal RACTV inputted to the second chip 200 is delayed by the first delay unit 210 and is outputted as the first delayed refresh signal RACTV_dl1.

The first delayed refresh signal RACTV_dl1 is inputted to the first core region 230. The first core region 230 which has received the first delayed refresh signal RACTV_dl1 performs the refresh operation.

The first delayed refresh signal RACTV_dl1 is not provided to the first chip 100 through the through-silicon via 502, because the first selection unit 220 receives the disabled first select signal TOP1.

The first delayed refresh signal RACTV_dl1 is inputted to the third chip 300 through the through-silicon via 503.

The first delayed refresh signal RACTV_dl1 inputted to the third chip 300 is delayed by the second delay unit 310 and is outputted as the second delayed refresh signal RACTV_dl2.

The second delayed refresh signal RACTV_dl2 is inputted to the second core region 330. The second core region 330 which has received the second delayed refresh signal RACTV_dl2 performs the refresh operation.

The second delayed refresh signal RACTV_dl2 is not provided to the second chip 200 through the through-silicon via 504, because the second selection unit 320 receives the disabled second select signal TOP2. The second delayed refresh signal RACTV_dl2 is inputted to the fourth chip 400 through the through-silicon via 505.

The second delayed refresh signal RACTV_dl2 inputted to the fourth chip 400 is delayed by the third delay unit 410 and is outputted as the third delayed refresh signal RACTV_dl3.

The third delayed refresh signal RACTV_dl3 is inputted to the third core region 430. The third core region 430 which has received the third delayed refresh signal RACTV_dl3 performs the refresh operation.

The third selection unit 420 which has received the enabled third select signal TOP3 outputs the third delayed refresh signal RACTV_dl3 to the through-silicon via 506 as RACTV_fb.

Then, the third delayed refresh signal RACTV_dl3 is provided to the first chip 100 through the through-silicon vias 506, 504 and 502 as the refresh feedback signal RACTV_fb. The first chip 100 which has received the refresh feedback signal RACTV_fb ends the refresh operation.

As is apparent from the above descriptions, the semiconductor memory apparatus according to the embodiment of the present invention is configured to sequentially perform refresh operations of respective chips by sequentially delaying a refresh signal using through-silicon vias which couple the chips to one another. Also, the semiconductor memory apparatus is configured to end a refresh operation by being fed back with a sequentially delayed refresh signal from a chip which is stacked uppermost.

As a consequence, the semiconductor memory apparatus according to the embodiment of the present invention provides advantages in that, since the refresh operations of the respective chips are performed with different timings, it is possible to prevent power noise which otherwise occurs as chips simultaneously perform is refresh operations.

Figure 3:
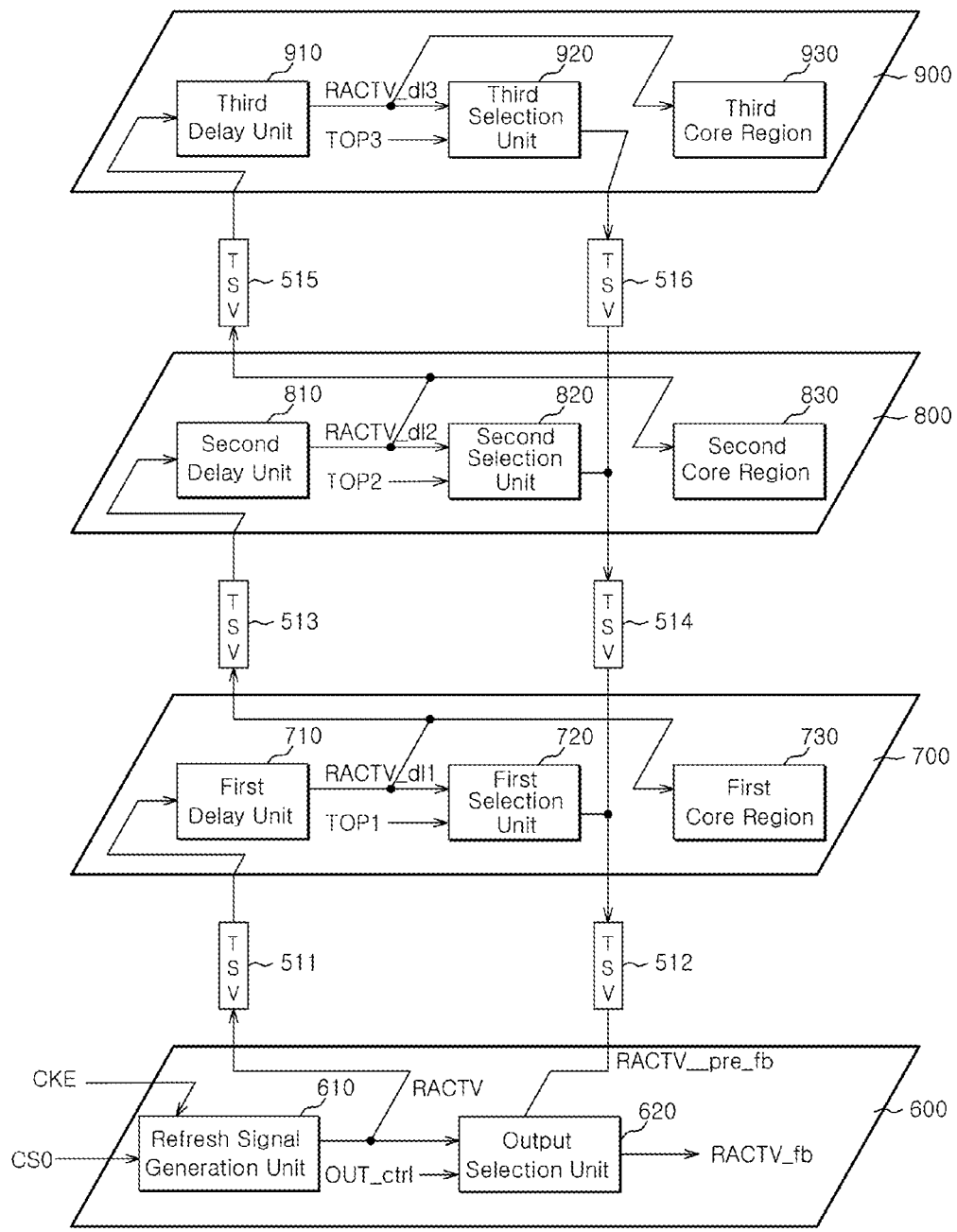
FIG. 3 is a block diagram of a semiconductor memory apparatus in accordance with an embodiment of the present invention.

Referring to FIG. 3, a semiconductor memory apparatus in accordance with an embodiment of the present invention may include first to fourth chips 600 to 900. The first to fourth chips 600 to 900 is disposed to be stacked, and are coupled to one another by through-silicon vias 511 to 516.

The first chip 600 receives external commands CS0 and CKE and generates a refresh signal RACTV. For example, the first chip 600 is configured to generate the refresh signal RACTV in response to a chip select signal CS0 and a clock enable signal CKE as the external commands CS0 and CKE. Also, the first chip 600 is configured to output one of a signal which is acquired by delaying the refresh signal RACTV and a preliminary refresh feedback signal RACTV_pre_fb which is inputted through the through-silicon via 512, as a refresh feedback signal RACTV_fb in response to an output control signal OUT_ctrl.

The first chip 600 may include a refresh signal generation unit 610 and an output selection unit 620.

The refresh signal generation unit 610 is configured to generate the refresh signal RACTV in response to the external commands CS0 and CKE.

The output selection unit 620 is configured to output one of the signal which is acquired by delaying the refresh signal RACTV and the preliminary refresh feedback signal RACTV_pre_fb which is inputted through the through-silicon via 512, as the refresh feedback signal RACTV_fb in response to the output control signal OUT_ctrl.

The second chip 700 may be stacked on the first chip 600, and the second chip 700 and the first chip 600 are electrically coupled to each other by the through-silicon vias 511 and 512.

The second chip 700 is configured to generate a first delayed refresh signal RACTV_dl1 by delaying the refresh signal RACTV, and performs a refresh operation in response to the first delayed refresh signal RACTV_dl1. The second chip 700 is configured to output the first delayed refresh signal RACTV_dl1 as the preliminary refresh feedback signal RACTV_pre_fb to the first chip 600 in response to a first select signal TOP1.

The second chip 700 may include a first delay unit 710, a first selection unit 720, and a first core region 730.

The first delay unit 710 is configured to delay the refresh signal RACTV and to output the first delayed refresh signal RACTV_dl1.

The first selection unit 720 is configured to output the first delayed refresh signal RACTV_dl1 as the preliminary refresh feedback signal RACTV_pre_fb to the first chip 600 when the first select signal TOP1 is enabled.

The first core region 730 is configured to perform the refresh operation in response to the first delayed refresh signal RACTV_dl1. The refresh signal RACTV of the first chip 600 is provided to the second chip 700 using the through-silicon via 511, and the first delayed refresh signal RACTV_dl1 is provided to the first chip 600, as the preliminary refresh feedback signal RACTV_pre_fb using the through-silicon via 512.

The third chip 800 is stacked on the second chip 700, and the third chip 800 and the second chip 700 are electrically coupled to each other by the through-silicon vias 513 and 514.

The third chip 800 is configured to generate a second delayed refresh signal RACTV_dl2 by delaying the first delayed refresh signal RACTV_dl1, and to perform a refresh operation in response to the second delayed refresh signal RACTV_dl2. The third chip 800 outputs the second delayed refresh signal RACTV_dl2 as the preliminary refresh feedback signal RACTV_pre_fb to the first chip 600 through the second chip 700 in response to a second select signal TOP2.

The third chip 800 may include a second delay unit 810, a second selection unit 820, and a second core region 830.

The second delay unit 810 is configured to delay the first delayed refresh signal RACTV_dl1 and to output the second delayed refresh signal RACTV_dl2.

The second selection unit 820 is configured to output the second delayed refresh signal RACTV_dl2 as the preliminary refresh feedback signal RACTV_pre_fb to the first chip 600 through the second chip 700 when the second select signal TOP2 is enabled.

The second core region 830 is configured to perform the refresh operation in response to the second delayed refresh signal RACTV_dl2 as RACTV_pre_fb. The first delayed refresh signal RACTV_dl1 of the second chip 700 is provided to the third chip 800 through the through-silicon via 513, and the second delayed refresh signal RACTV_dl2 as RACTV_pre_fb is provided to the second chip 700 using the through-silicon via 514. That is, the second chip 700, which has received the second delayed refresh signal RACTV_dl2, as RACTV_pre_fb, outputs the second delayed refresh signal RACTV_dl2 as the preliminary refresh feedback signal RACTV_pre_fb to the first chip 600 through the through-silicon via 512.

The fourth chip 900 is stacked on the third chip 800, and the fourth chip 900 and the third chip 800 are electrically coupled to each other by the through-silicon vias 515 and 516.

The fourth chip 900 is configured to generate a third delayed refresh signal RACTV_dl3 by delaying the second delayed refresh signal RACTV_dl2, and to perform a refresh operation in response to the third delayed refresh signal RACTV_dl3. The fourth chip 900 outputs the third delayed refresh signal RACTV_dl3 as the preliminary refresh feedback signal RACTV_pre_fb to the first chip 600 through the third and second chips 800 and 700 in response to a third select signal TOP3.

The fourth chip 900 includes a third delay unit 910, a third selection unit 920 and a third core region 930.

The third delay unit 910 is configured to delay the second delayed refresh signal RACTV_dl2 and to output the third delayed refresh signal RACTV_dl3.

The third selection unit 920 is configured to output the third delayed refresh signal RACTV_dl3 as the preliminary refresh feedback signal RACTV_pre_fb to the first chip 600 through the third and second chips 800 and 700 when the third select signal TOP3 is enabled.

The third core region 930 is configured to perform the refresh operation in response to the third delayed refresh signal RACTV_dl3. The second delayed refresh signal RACTV_dl2 of the third chip 800 is provided to the fourth chip 900 through the through-silicon via 515, and the third delayed refresh signal RACTV_dl3 is provided to the second chip 700 as RACTV_pre_fb through the through-silicon via 516, through the third chip 800, and through the through-silicon via 514. That is, the third chip 800, which has received the third delayed refresh signal RACTV_dl3 as RACTV_pre_fb, outputs the third delayed refresh signal RACTV_dl3 to the second chip 700 through the through-silicon via 514. The second chip 700, which has received the signal RACTV_pre_fb, outputs RACTV_pre_fb to the first chip 600 through the through-silicon via 512. The first to third select signals TOP1 to TOP3 are signals which can be enabled such that only one of the first to third select signals TOP1 to TOP3 is enabled depending on which chip is the uppermost chip in the stack. That is to say, in the semiconductor memory apparatus in which the first to fourth chips 600 to 900 are stacked as shown in FIG. 3, only the third select signal TOP3, which is inputted to the third selection unit 920 of the fourth chip 900 as the uppermost chip, is enabled, and the first and second select signals TOP1 and TOP2 are disabled.

Figure 4:
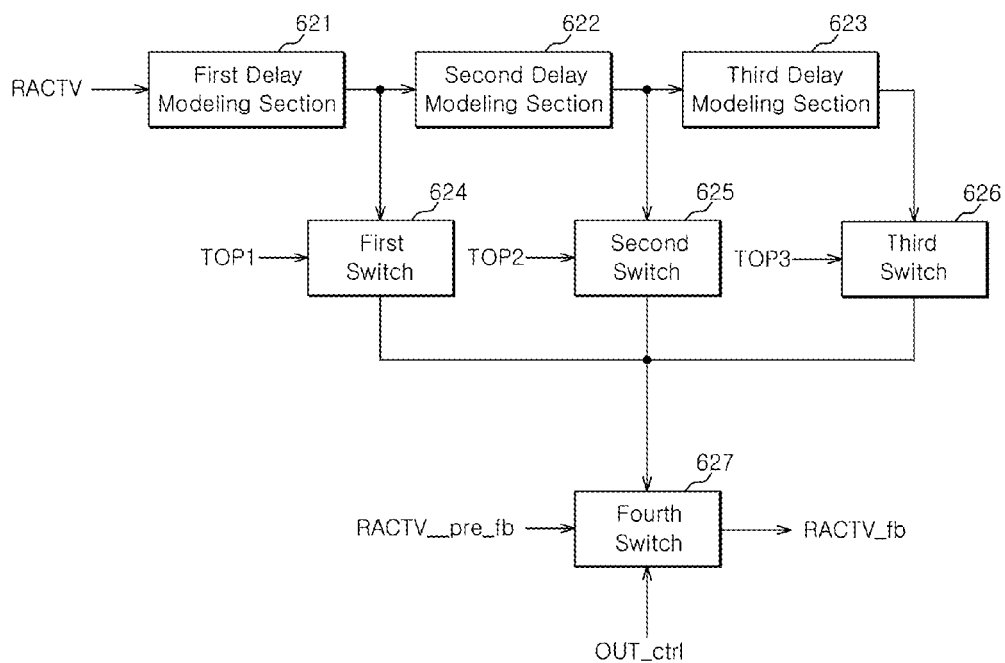
FIG. 4 is a block diagram of the output selection unit of FIG. 3.

Referring to FIG. 4, the selection path of the device of FIG. 3 may be modeled using a model that includes first to third delay modeling sections 621-623 and first to fourth switches 624-627.

The first delay modeling section 621 is configured to delay the refresh signal RACTV which is outputted from the refresh signal generation unit 610. The first delay modeling section 621 may have the same delaying time (or delaying amount) as the first delay unit 710 of the second chip 700.

The second delay modeling section 622 is configured to delay the output signal of the first delay modeling section 621.

The second delay modeling section 622 has the same delaying time (or delaying amount) as the second delay unit 810 of the third chip 800.

The third delay modeling section 623 is configured to delay the output signal of the second delay modeling section 622. The third delay modeling section 623 has the same delaying time (delaying amount) as the third delay unit 910 of the fourth chip 900.

The first switch 624 transfers the output signal of the first delay modeling section 621 to the fourth switch 627, when the first select signal TOP1 is enabled. If the first select signal TOP1 is disabled, the first switch 624 prevents the output signal of the first delay modeling section 621 from being transferred to the fourth switch 627.

The second switch 625 transfers the output signal of the second delay modeling section 622 to the fourth switch 627 when the is second select signal TOP2 is enabled. If the second select signal TOP2 is disabled, the second switch 625 prevents the output signal of the second delay modeling section 622 from being transferred to the fourth switch 627.

The third switch 626 transfers the output signal of the third delay modeling section 623 to the fourth switch 627 when the third select signal TOP3 is enabled. If the third select signal TOP3 is disabled, the third switch 626 prevents the output signal of the third delay modeling section 623 from being transferred to the fourth switch 627.

The fourth switch 627 outputs one of the output signals of the first to third switches 624 to 626 or the preliminary refresh feedback signal RACTV_pre_fb as the refresh feedback signal RACTV_fb in response to the output control signal OUT_ctrl. For example, the fourth switch 627 outputs one of the output signals of the first to third switches 624 to 626 as the refresh feedback signal RACTV_fb when the output control signal OUT_ctrl is enabled. Further, the fourth switch 627 outputs the preliminary refresh feedback signal RACTV_pre_fb as the refresh feedback signal RACTV_fb when the output control signal OUT_ctrl is disabled. Since the first to third select signals TOP1 to TOP3 are signals in which only one signal is enabled and the remaining signals are disabled, only one switch of the first to third switches 624 to 626 outputs the received signal, and the remaining switches do not output the received signals.

Operations of the semiconductor memory apparatus is according to an embodiment of the present invention, configured as mentioned above, will be described below with reference to FIGS. 3 and 4. It is assumed that the semiconductor memory apparatus according to an embodiment of the present invention is a semiconductor apparatus in which the first to fourth chips 600 to 900 are stacked, and, since the fourth chip 900 is the chip which is positioned uppermost, among the first to third select signals TOP1 to TOP3, only the third select signal TOP3 is enabled and the first and second select signals TOP1 and TOP2 are disabled.

The refresh signal generation unit 610 of the first chip 600 generates the refresh signal RACTV in response to the external commands CS0 and CKE.

The refresh signal RACTV is inputted to the second chip 700 through the through-silicon via 511.

The refresh signal RACTV inputted to the second chip 700 is delayed by the first delay unit 710 and is outputted as the first delayed refresh signal RACTV_dl1.

The first delayed refresh signal RACTV_dl1 is inputted to the first core region 730. The first core region 730 which has received the first delayed refresh signal RACTV_dl1 performs the refresh to operation.

The first selection unit 720 which has received the disabled first select signal TOP1 prevents the first delayed refresh signal RACTV_dl1 from being outputted to the through-silicon via 512.

The first delayed refresh signal RACTV_dl1 is inputted to the third chip 800 through the through-silicon via 513.

The first delayed refresh signal RACTV_dl1 inputted to the third chip 800 is delayed by the second delay unit 810 and is outputted as the second delayed refresh signal RACTV_dl2.

The second delayed refresh signal RACTV_dl2 is inputted to the second core region 830. The second core region 830 which has received the second delayed refresh signal RACTV_dl2 performs the refresh operation.

The second selection unit 820 which has received the disabled second select signal TOP2 prevents the second delayed refresh signal RACTV_dl2 from being outputted to the through-silicon via 514.

The second delayed refresh signal RACTV_dl2 is inputted to the fourth chip 900 through the through-silicon via 515.

The second delayed refresh signal RACTV_dl2 inputted to the fourth chip 900 is delayed by the third delay unit 910 and is outputted as the third delayed refresh signal RACTV_dl3.

The third delayed refresh signal RACTV_dl3 is inputted to the third core region 930. The third core region 930 which has received the third delayed refresh signal RACTV_dl3 performs the refresh operation.

The third selection unit 920 which has received the enabled third select signal TOP3 outputs the third delayed refresh signal RACTV_dl3 to the through-silicon via 516.

The third delayed refresh signal RACTV_dl3 outputted to the through-silicon via 516 is provided to the first chip 600 through the through-silicon vias 514 and 512 as the preliminary refresh feedback signal RACTV_pre_fb.

The output selection unit 620 of the first chip 600 outputs the preliminary refresh feedback signal RACTV_pre_fb or the signal acquired by delaying the refresh signal RACTV by a time corresponding to the total sum of the delay times of the first to third delay units 710, 810 and 910, as the refresh feedback signal RACTV_fb in response to the output control signal OUT_ctrl. In detail, the output selection unit 620 outputs the preliminary refresh feedback signal RACTV_pre_fb as the refresh feedback signal RACTV_fb, when the output control signal OUT_ctrl is enabled. Also, when the output control signal OUT_ctrl is disabled, the output selection unit 620 delays the refresh signal RACTV by all of the first to third delay modeling sections 621 to 623 as shown in FIG. 4, and outputs the delayed refresh signal RACTV as the refresh feedback signal RACTV_fb. In the event that the preliminary refresh feedback signal RACTV_pre_fb is not inputted from the fourth chip 900 due to a fail in the through-silicon vias 511 to 516 which couple the chips to one another, the output selection unit 620 is configured to delay the refresh signal RACTV by the time corresponding to the total sum of the delay times of the first to third delay units 710, 810 and 910 and end the refresh operation using the output signal of the output selection unit 620. Here, total sum of the delay times of the first to third delay units 710, 810 and 910 can be corresponded to that of the delay times of the first to third delay modeling sections 621 to 623. As is apparent from the above descriptions, the semiconductor memory apparatus in accordance with the embodiment of the present invention is configured to sequentially perform refresh operations of respective chips by sequentially delaying a refresh signal through through-silicon vias which couple the chips to one another. Also, the semiconductor memory apparatus is configured to end a refresh operation in response to a sequentially delayed refresh signal being fed back from a chip that is the uppermost chip in the stack of chips.

As a consequence, the semiconductor memory apparatus in accordance with the embodiment of the present invention provides advantages in that, since the refresh operations of the respective chips are performed with different timing, it is possible to prevent power noise which otherwise occurs as chips simultaneously perform refresh operations.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus in which a plurality of chips are stacked and are coupled by through vias, comprising:
    a first chip including a refresh signal generation unit which is configured to generate a refresh signal in response to an external command;
    a second chip configured to generate a first delayed refresh signal by delaying the refresh signal, and perform a refresh operation in response to the first delayed refresh signal; and
    a third chip configured to generate a second delayed refresh signal by delaying the first delayed refresh signal, perform a refresh operation in response to the second delayed refresh signal, and output the second delayed refresh signal to the first chip,
    wherein the first chip includes an output selection unit which is configured to generate a totally delayed refresh signal and to output one of the second delayed refresh signal and the totally delayed refresh signal as a refresh feedback signal in response to an output control signal,
    wherein the totally delayed refresh signal is obtained by delaying the refresh signal by a time corresponding to a sum of a delaying time for generating the first delayed refresh signal and a delaying time for generating the second delayed refresh signal.

2. The semiconductor memory apparatus according to claim 1, wherein the second chip comprises:
    a first delay unit configured to delay the refresh signal and to generate the first delayed refresh signal;
    a first selection unit configured to output the first delayed refresh signal to the first chip when a first select signal is enabled; and
    a first core region configured to receive the first delayed refresh signal and to perform the refresh operation.

3. The semiconductor memory apparatus according to claim 2, wherein the third chip comprises:
    a second delay unit configured to delay the first delayed refresh signal and to generate the second delayed refresh signal;
    a second selection unit configured to output the second delayed refresh signal to the first chip when a second select signal is enabled; and
    a second core region configured to receive the second delayed refresh signal and to perform the refresh operation.

4. The semiconductor memory apparatus according to claim 3, wherein the output selection unit comprises:

a delay control section configured to delay the refresh signal by the same time as the sum of a delay time of the first delay unit and a delay time of the second delay unit, and generate the totally delayed refresh signal; and a switch configured to output one of the second delayed refresh signal and the totally delayed refresh signal as the refresh feedback signal in response to the output control signal.

5. A semiconductor memory apparatus, comprising:

a base chip;

a plurality of chips configured to sequentially stacked on the base chip; and a plurality of through vias configured to couple between the base chip and a chip stacked on the base chip, and adjacent stacked chips, respectively;

wherein the plurality of chips are configured to generate a plurality of delayed refresh signals, and delaying amount of the plurality of delay refresh signals are increase as stacking levels are higher, wherein the base chip is configured to receive a delaying refresh signal generated in a lowermost chip of the plurality of chips, and a delaying refresh signal generated in an uppermost chip of the plurality of chips.

6. The semiconductor memory apparatus according to claim 5, further comprising:

an output selection unit configured to selectively output the delaying refresh signal generated in the lowermost chip of the plurality of chips, and the delaying refresh signal generated in the uppermost chip of the plurality of chips.

* * * * *

UNITED STATES PATENT AND TRADEMARK OFFICE
CERTIFICATE OF CORRECTION

| | | |
|---|---|---|
| PATENT NO. | : 9,058,854 B2 | Page 1 of 1 |
| APPLICATION NO. | : 13/845390 | |
| DATED | : June 16, 2015 | |
| INVENTOR(S) | : Ko | |

It is certified that error appears in the above-identified patent and that said Letters Patent is hereby corrected as shown below:

Title page

Item (72) Inventor: Should read as follows:

-- Jae Bum Ko --.

Signed and Sealed this
Tenth Day of November, 2015

Michelle K. Lee
*Director of the United States Patent and Trademark Office*